(12) United States Patent
Okamoto et al.

(10) Patent No.: US 8,767,781 B2
(45) Date of Patent: Jul. 1, 2014

(54) WAVELENGTH TUNABLE LASER DEVICE, OPTICAL MODULE, AND METHOD OF CONTROLLING WAVELENGTH TUNABLE LASER

(75) Inventors: Takeshi Okamoto, Tokyo (JP); Kenji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 150 days.

(21) Appl. No.: 13/503,362

(22) PCT Filed: Aug. 18, 2010

(86) PCT No.: PCT/JP2010/063908
§ 371 (c)(1),
(2), (4) Date: May 7, 2012

(87) PCT Pub. No.: WO2011/048869
PCT Pub. Date: Apr. 28, 2011

(65) Prior Publication Data
US 2012/0219024 A1    Aug. 30, 2012

(30) Foreign Application Priority Data

Oct. 22, 2009   (JP) ................................ 2009-243914

(51) Int. Cl.
*H01S 3/04*      (2006.01)
*H01S 3/10*      (2006.01)

(52) U.S. Cl.
USPC .............................................. 372/20; 372/34

(58) Field of Classification Search
USPC ..................................................... 372/20, 34
See application file for complete search history.

(56) References Cited

U.S. PATENT DOCUMENTS

| | | | |
|---|---|---|---|
| 5,060,235 A | 10/1991 | Ikeda | |
| 2005/0100065 A1* | 5/2005 | Coldren et al. | 372/38.02 |
| 2007/0258494 A1* | 11/2007 | Davies et al. | 372/20 |
| 2009/0041072 A1 | 2/2009 | Oguro | |
| 2009/0324255 A1 | 12/2009 | Nakamoto | |
| 2010/0103963 A1 | 4/2010 | Fujiwara et al. | |

FOREIGN PATENT DOCUMENTS

| | | |
|---|---|---|
| JP | 3-009587 A | 1/1991 |
| JP | 3-018083 A | 1/1991 |
| JP | 7-111354 A | 4/1995 |

(Continued)

OTHER PUBLICATIONS

International Search Report in PCT/JP2010/063908 dated Sep. 28, 2010 (English Translation Thereof).

*Primary Examiner* — Armando Rodriguez
(74) *Attorney, Agent, or Firm* — McGinn IP Law Group, PLLC (57) ABSTRACT

Provided is a power saving and highly reliable wavelength tunable laser device.

A wavelength tunable laser device 10 of the present invention includes:
  a wavelength tunable laser 11 including:
    a laser resonator including a light source 111 and wavelength tunable mechanisms 112 and 113; and
    light loss control units 114a and 114b;
  a temperature detecting element 12 detecting a temperature of the wavelength tunable laser 11; and
  a controller 13, wherein
    the controller 13 obtains temperature information a of the wavelength tunable laser 11 from the temperature detecting element 12, calculates wavelength tunable control parameters d and e and light loss control parameters b1 and b2 based on the temperature information a, controls the wavelength tunable mechanisms 112 and 113 based on the wavelength tunable control parameters d and e, and controls light loss control units 114a and 114b based on the light loss control parameters b1 and b2.

18 Claims, 6 Drawing Sheets

(56) References Cited

FOREIGN PATENT DOCUMENTS

| JP | 10-084130 A | 3/1998 |
|---|---|---|
| JP | 2000-124541 A | 4/2000 |
| JP | 2007-533151 A | 11/2007 |
| JP | 2008-147290 A | 6/2008 |
| JP | 2008-218947 A | 9/2008 |
| JP | 2008-242366 A | 10/2008 |
| WO | WO2008/126276 A1 | 10/2008 |

* cited by examiner

WAVELENGTH TUNABLE LASER DEVICE, OPTICAL MODULE, AND METHOD OF CONTROLLING WAVELENGTH TUNABLE LASER

TECHNICAL FIELD

The present invention relates to a wavelength tunable laser device, an optical module, and a method of controlling a wavelength tunable laser.

BACKGROUND ART

In recent years, along with the rapid proliferation of the Internet, there has been a demand for an increase in capacity of a communication traffic. In response to this demand, an increase in transmission speed of a single channel per system and an expansion of the number of channels in accordance with the wavelength division multiplexing (WDM) are progressed. In the WDM, plural optical signals assigned to different carrier wavelengths (channels) can be transmitted simultaneously and a communication capacity can be increased according to the number of channels. Further, in the WDM, the respective channel wavelengths are sufficiently separated from one another. For example, the communication capacity reaches 1 terabit/sec by transmitting 100 channels using one common optical fiber with the modulation of 10 gigabit/sec per channel.

In the middle and long-distance optical communications in these years, a C band (1530 to 1570 nm) that can be amplified by an optical fiber amplifier (EDFA: erbium-doped fiber amplifier) is used widely. In the WDM, for example, with respect to 100 channels used in optical communications, 100 types of laser devices corresponding to the respective channels are required. Therefore, costs for inventory control, inventory count, and the like of the laser devices are increased. In order to solve this problem, in the middle and long-distance communications, there is a demand for a wavelength tunable laser device that can cover the entire C band singly.

An example of the light source of the wavelength tunable laser device includes a light source including a semiconductor optical amplifier (SOA), a wavelength tunable filter, and a reflector (external resonator type wavelength tunable laser or the like). The wavelength tunable filter controls the oscillation wavelength of the laser by changing the refractive index of a filter portion (the refractive index of a material of a filter portion). Examples of the publicly known document in which a wavelength tunable laser device provided with such a light source is described include Patent Documents 1 to 4.

RELATED ART DOCUMENT

Patent Document

[Patent Document 1] JP H3-9587 A
[Patent Document 2] JP 2008-242366 A
[Patent Document 3] JP 2007-533151 A
[Patent Document 4] JP 2000-124541 A

SUMMARY OF INVENTION

Problem to be Solved by the Invention

For changing the refractive index of a filter portion (the refractive index of a material of a filter portion), for example, a carrier plasma effect by current injection, an electro-optic effect by voltage application, a thermo-optic effect by heating with a heater, and the like can be employed. The change of the refractive index by the thermo-optic effect may occur also by the temperature change of the whole element of the wavelength tunable laser. In order to avoid this change, the temperature of the whole element of the wavelength tunable laser is controlled using a thermoelectric cooler (TEC) with an accuracy of 0.01 K, for example.

However, the power consumption of the TEC is greater than that of the wavelength tunable laser. As an example, the power consumption of the wavelength tunable laser is about 0.2 W whereas the TEC requires an electric power of about 2 W for reducing the temperature by 50° C. from 75° C. to 25° C. In other words, the power consumption of the current wavelength tunable laser device depends on the TEC. Therefore, if the wavelength tunable laser device that does not require the TEC or the wavelength tunable laser device with the TEC capable of reducing the power consumption can be achieved, the power consumption of a light output module can be reduced greatly.

Patent Documents 1 to 4 each disclose a device that controls the wavelength tunable laser by a method other than the temperature control by the TEC. Specifically, Patent Documents 1 to 4 disclose as follows. Patent Document 1 discloses a device provided with a reflectance control mechanism using a directional coupler. Patent Document 2 discloses a device provided with an output light intensity control mechanism using a directional coupler. Patent Document 3 discloses a device provided with a mechanism that measures the temperature of a wavelength tunable laser and adjusts a bias applied to the wavelength tunable laser according to the temperature measured. Patent Document 4 discloses a device that monitors the photocurrent that flows in an electroabsorption portion and keeps the photocurrent value constant to obtain a forward light output at a constant light intensity level.

However, in the devices disclosed in Patent Documents 1, 2, and 4, with respect to a wavelength tunable filter for deciding the wavelength of the laser, an oscillation wavelength changes by the change in refractive index due to the temperature change. Therefore, there is a problem that the operation of the wavelength tunable laser becomes unstable as compared to the case in which the temperature is kept constant.

Further, in the devices disclosed in Patent Documents 1 to 3, when the temperature of the laser element is increased, the gain peak wavelength is increased and the gain is decreased in an active layer, and thereby the laser light output is decreased. Therefore, the laser is required to be driven at a higher current density with a higher temperature to obtain a constant output even if the temperature changes. This may cause the life degradation (reliability degradation) of an element.

The present invention is intended to provide a power saving and highly reliable wavelength tunable laser device, an optical module, and a method of controlling a wavelength tunable laser.

Means for Solving Problem

In order to achieve the aforementioned object, the wavelength tunable laser device of the present invention includes:
 a wavelength tunable laser;
 a temperature detecting element; and
 a controller, wherein
 the wavelength tunable laser includes:
  a laser resonator including:
   a light source; and
   wavelength tunable mechanisms; and
  at least one light loss control unit, the temperature detecting element is thermally connected to the wavelength tunable laser and is electrically connected to the controller, the controller is electrically connected to the wavelength tunable mechanisms and the light loss control unit, the temperature detecting element detects a temperature of the wavelength tunable laser, and the controller obtains temperature information of the wavelength tunable laser from the temperature detecting element, calculates wavelength tunable control parameters and light loss control parameters based on the temperature information, controls the wavelength tunable mechanisms based on the wavelength tunable control parameters, and controls the light loss control unit based on the light loss control parameter.

The optical module of the present invention includes the wavelength tunable laser device of the present invention.

The method of controlling a wavelength tunable laser of the present invention uses the wavelength tunable laser device of the present invention and includes the following processes:

detecting a temperature of the wavelength tunable laser by the temperature detecting element;

obtaining temperature information of the wavelength tunable laser by the controller from the temperature detecting element;

calculating wavelength tunable control parameters and light loss control parameters by the controller based on the temperature information;

controlling the wavelength tunable mechanisms by the controller based on the wavelength tunable control parameters; and controlling the light loss control unit by the controller based on the light loss control parameter.

Effects of the Invention

According to the present invention, a power saving and highly reliable wavelength tunable laser device, an optical module, and a method of controlling a wavelength tunable laser can be provided.

DESCRIPTION OF EMBODIMENTS

Hereinafter, the wavelength tunable laser device, the optical module, and the method of controlling a wavelength tunable laser of the present invention will be described in detail. However, the present invention is not limited to the following embodiments. Note here that in FIGS. 1 to 7 below, identical parts are indicated with identical numerals and symbols. Further, in the present invention, in the case where the present invention is specified by numerical limitations, it may be strictly specified by the numerical value or may be roughly specified by the numerical value.

Embodiment 1

Figure 1:
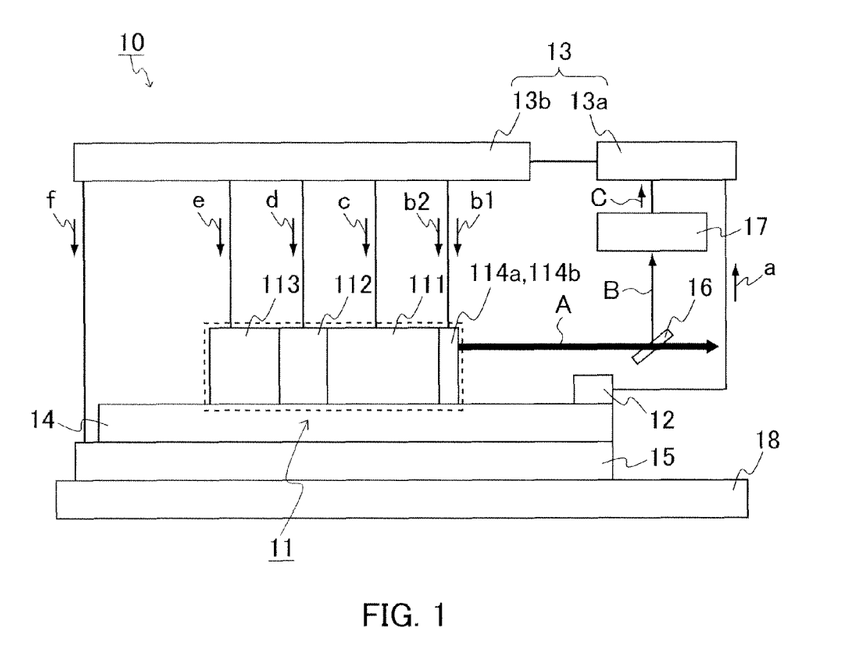
FIG. 1 is a block diagram showing an example of the configuration of the wavelength tunable laser device (Embodiment 1) of the present invention.

FIG. 1 shows the configuration of the wavelength tunable laser device of the present Embodiment. As shown in FIG. 1, a wavelength tunable laser device 10 includes a wavelength tunable laser 11, a temperature detecting element 12, and a controller 13 as main components. The wavelength tunable laser 11 includes a laser resonator that includes a gain region 111 serving as a light source and a wavelength stabilization region 112 and a wavelength tunable filter region 113 serving as wavelength tunable mechanisms; and an absorption region 114a and a light reflectance variable mirror 114b serving as light loss control units. The absorption region 114a and the light reflectance variable mirror 114b are arranged at the light emitting end surface side of the gain region 111. The wavelength stabilization region 112 and the wavelength tunable filter region 113 are arranged at the opposite side to the light emitting end surface of the gain region 111. The wavelength tunable laser 11 and the temperature detecting element 12 are mounted at the upper side of a subcarrier 14 at an appropriate gap from each other and are thermally connect each other. The wavelength tunable laser 11 is mounted at the upper side of a thermoelectric cooler (TEC) 15 via the subcarrier 14. The TEC 15 corresponds to a "temperature controller" that controls the temperature of the wavelength tunable laser 11. The controller 13 includes: a circuit 13a that includes a digital signal processor (DSP); and a current distribution circuit 13b electrically connected to the circuit 13a. The temperature detecting element 12 is electrically connected to the circuit 13a. The current distribution circuit 13b is electrically connected to the absorption region 114a, the light reflectance variable mirror 114b, the gain region 111, the wavelength stabilization region 112, the wavelength tunable filter region 113, and the TEC 15. The wavelength tunable laser device 10 further includes a beam splitter 16 and a photodetector 17. The photodetector 17 is electrically connected to the circuit 13a. The wavelength tunable laser device 10 is mounted at the upper side of a heat sink 18.

Note here that in the present invention, unless otherwise noted, "at the upper side" is not limited to a state where a first component is directly in contact with the upper surface of a second component (on) but may include a state where another component is present between two components, i.e., a state where the first component is not directly in contact with the upper surface of the second component (above). Similarly, unless otherwise noted, "at the lower side" may include a state where a first component is directly in contact with the lower surface of a second component (on) or a state where another component is present between two components, i.e., a state where the first component is not directly in contact with the lower surface of the second component (below). Further, "on the upper surface" indicates a state where a first component is directly in contact with the upper surface of a second component. Similarly, "on the lower surface" indicates a state where a first component is directly in contact with the lower surface of a second component. Unless otherwise noted, "at the one side" may include a state where a first component is directly in contact with the one side of a second component or a state where another component is present between two components, i.e., a state where the first component is not directly in contact with the one side of the second component. The same applies to "at the both sides". "On the one side" indicates a state where a first component is directly in contact with the one side of a second component. The same applies to "on the both sides".

Although the wavelength tunable laser device of the present Embodiment includes both of the absorption region and the light reflectance variable mirror as the light loss control units, the present invention is not limited to this example and the wavelength tunable laser device may be provided with one of the absorption region and the light reflectance variable mirror or may be provided with other light loss control unit(s). As the other light loss control unit, for example, an optical waveguide including a semiconductor with a bandgap having a composition wavelength narrower than laser light as a core layer may be employed. This optical waveguide is optically connected to the gain region, for example, by a known butt joint technique or the like. However, this connection is not limited to the butt joint technique.

In the wavelength tunable laser of the present Embodiment, the gain region 111, which is the active element (light source) of the wavelength tunable laser 11, is a semiconductor optical amplifier (SOA). A multiple quantum well (MQW) is formed in the semiconductor optical amplifier. By the multiple quantum well, light is generated and amplified in response to the injection of current.

The wavelength stabilization region 112, which is the passive element of the wavelength tunable laser 11, is composed of bulk composition or a multiple quantum well, and is a region in which the bandgap is set wide to the degree of not absorbing laser oscillation light. With respect to the wavelength stabilization region 112, the refractive index of the region changes according to the injection of current or the application of voltage. The gain region 111 and the wavelength stabilization region 112 can be produced, for example, by a known butt joint technique, a known selective growth technique, a known load binding technique, or the like. The both regions are electrically separated in a sufficient manner. There is a segregation resistance of, for example, at least 1 kΩ between the both regions so that currents of the both regions are prevented from being interfered with each other.

As described above, the wavelength tunable laser 11 includes the wavelength stabilization region 112 and the wavelength tunable filter region 113 serving as the wavelength tunable mechanisms. The oscillation wavelength can be controlled by these regions. Examples of the wavelength tunable filter region 113 include a ring resonator, a disc resonator, and a distributed Bragg reflector (DBR) filter.

Figure 2A:
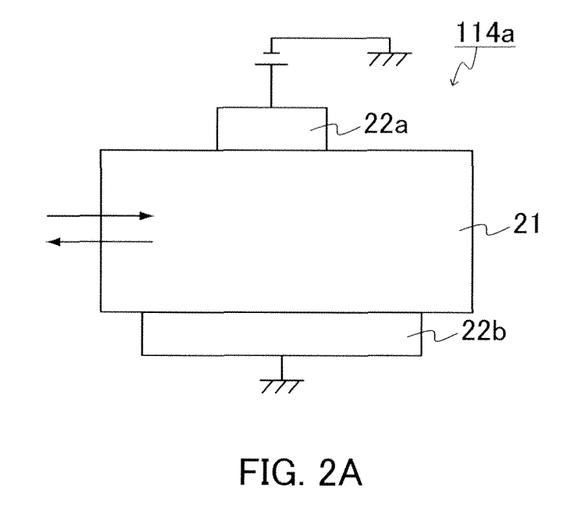
FIG. 2A is a block diagram showing the configuration of the absorption region used in the wavelength tunable laser device of Embodiment 1.
Figure 2B:
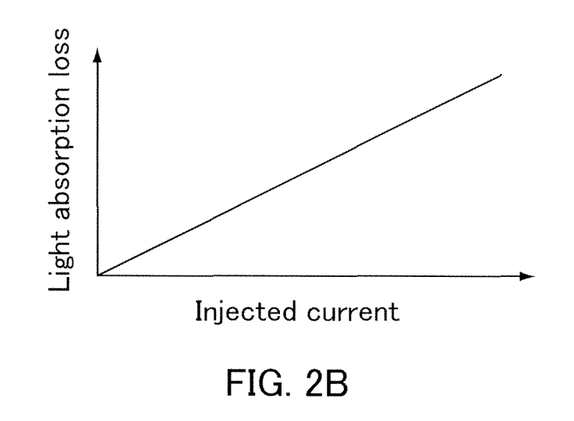
FIG. 2B is a graph showing the relationship between an injected current and a light absorption loss in the absorption region.

FIG. 2A shows an example of the configuration of the absorption region 114a. The arrows in FIG. 2A show light propagation directions. In the absorption region 114a, a semiconductor 21 is interposed between current-carrying electrodes 22a and 22b. In the absorption region 114a, as shown in FIG. 2B, a light absorption loss increases by a free carrier absorption effect in response to the energization (current injection) by the current-carrying electrodes 22a and 22b. By increasing the light absorption loss by energizing (injecting a current into) the absorption region, the oscillation threshold value of the semiconductor laser can be kept constant. Thereby, for example, a decrease of the oscillation threshold value of the semiconductor laser due to a temperature decrease can be prevented.

Figure 3A:
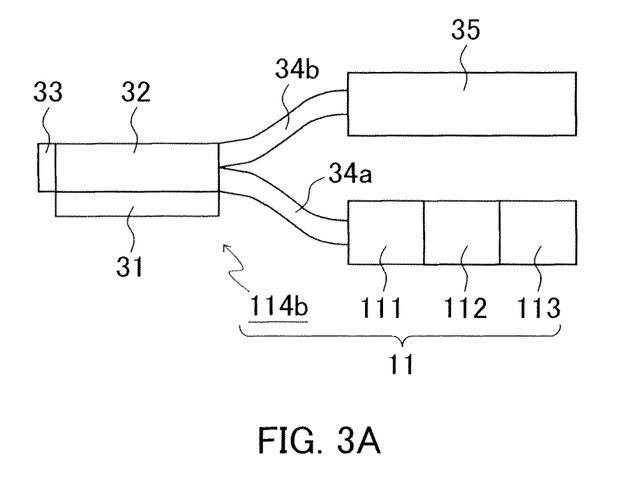
FIG. 3A is a schematic view showing the configuration of the light reflectance variable mirror used in the wavelength tunable laser device of Embodiment 1.

FIG. 3A shows an example of the configuration of the light reflectance variable mirror 114b. The light reflectance variable mirror 114b includes a current-carrying electrode 31, a directional coupler 32, and a reflector 33. The directional coupler 32 is optically connected to one end of an optical waveguide 34a and one end of an optical waveguide 34b. The other end of the optical waveguide 34a is optically connected to the gain region 111.

Figure 3B:
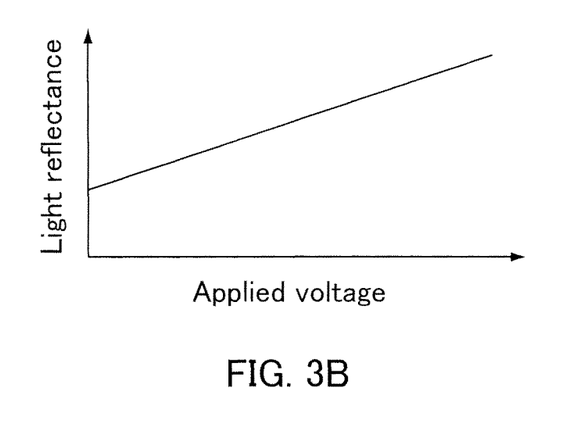
FIG. 3B is a graph showing the relationship between an applied voltage and a light reflectance in the light reflectance variable mirror.

In the light reflectance variable mirror 114b, laser light emitted from the gain region 111 enters the directional coupler 32 via the optical waveguide 34a. The entered laser light is reflected by the reflector 33. A certain amount of light out of the reflected light is returned to the gain region 111 side via the optical waveguide 34a. The rest of light is emitted outside via the optical waveguide 34b. As shown in FIG. 3A, in the case where the other end of the optical waveguide 34b is optically connected to a functional element 35, the light undergoes, for example, modulation, attenuation, wavelength conversion, or the like by the functional element 35. The amount of the light returned to the gain region 111 side can be adjusted, for example, by changing the light path length of the directional coupler 32. By changing the refractive index in the directional coupler 32 by a carrier plasma effect in response to the energization by the current-carrying electrode 31, the light path length of the directional coupler 32 can be changed. As a result, as shown in FIG. 3B, the light reflectance at the light emitting end surface of the gain region serving as the light source can be controlled.

As described above, the temperature detecting element 12 is thermally connected to the wavelength tunable laser 11. This thermal connection makes it possible to detect the temperature of the wavelength tunable laser 11. The temperature detecting element 12 monitors the temperature of the wavelength tunable laser 11 during driving. An example of the temperature detecting element 12 includes a thermistor.

The DSP-containing circuit 13a obtains temperature information of the wavelength tunable laser 11 from the temperature detecting element 12 and calculates various control parameters based on the obtained temperature information. Details will be described below. The current distribution circuit 13b controls the absorption region 114a, the light reflectance variable mirror 114b, the gain region 111, the wavelength stabilization region 112, the wavelength tunable filter region 113, and the TEC 15 based on the calculated various control parameters. Details will be described below.

In the wavelength tunable laser device of the present Embodiment, as described above, the wavelength tunable laser 11 is mounted at the upper side of the TEC 15 that controls an element temperature via the subcarrier 14. In the present invention, although a TEC (temperature controller) is not indispensable, the wavelength tunable laser device is preferably provided with the TEC because, for example, the following situation can be conceived. That is, since the control range of the wavelength tunable laser by the control of the light absorption loss and the light reflectance that will be described below is limited, the temperature range in which the drive current of the gain region can be kept constant is also limited. While the temperature of the wavelength tunable laser is within the temperature range in which the drive current of the gain region can be kept constant by the control of the light absorption loss and the light reflectance, for example, the TEC is kept inactivated. On the other hand, when the temperature of the wavelength tunable laser exceeds the temperature range, the TEC is activated to keep the temperature of the wavelength tunable laser within the temperature range. Thereby, the average of the power consumption of the wavelength tunable laser device of the present Embodiment during the whole driving time can be reduced greatly. As a result, the wavelength tunable laser device of the present Embodiment achieves power saving. The wavelength tunable laser device of the present Embodiment may be a device that does not need to activate the TEC within a normal use environment temperature range and that temporarily activates the TEC only at an extremely low or high temperature, for example.

Figure 4:
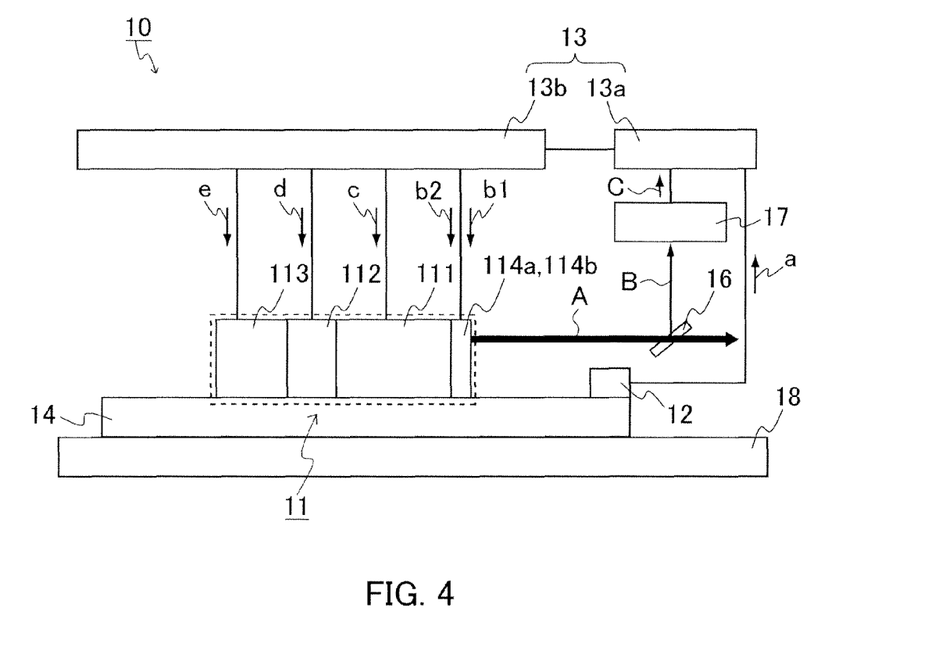
FIG. 4 is a block diagram showing the configuration of the wavelength tunable laser device of Embodiment 1 from which the TEC in is removed.

Further, for example, in the case where the wavelength tunable laser device of the present invention is used for the purpose in which the temperature of the wavelength tunable laser is not required to be kept within the temperature range by the TEC, the wavelength tunable laser device may not be provided with the TEC as shown in FIG. 4. This makes it possible to achieve a low-cost and compact device.

Some of the laser light A emitted from the wavelength tunable laser 11 are branched as a light power B for light output monitoring by the beam splitter 16. The light power B is received with the photodetector 17 for light output monitoring. Thereby, the light power of the light output can be taught from the branching ratio of the beam splitter 16. Examples of the photodetector 17 include a photodiode, and an avalanche photodiode.

Next, on the basis of FIGS. 1 to 3, the method of controlling a wavelength tunable laser using the wavelength tunable laser device of the present Embodiment will be described.

During operation of the wavelength tunable laser device of the present Embodiment, the temperature detecting element 12 monitors the temperature of the wavelength tunable laser 11. The temperature information a of the wavelength tunable laser 11 obtained by the monitoring is outputted to the circuit 13a. The circuit 13a calculates an absorption region control parameter for controlling the absorption region 114a and a light reflectance variable mirror control parameter for controlling the light reflectance variable mirror 114b based on the temperature information a. Examples of the absorption region control parameter include a current (Ima) injected into the absorption region 114a and a voltage (Vma) applied to the absorption region 114a. One of the absorption region control parameters may be used alone or two or more of them may be used in combination. Examples of the light reflectance variable mirror control parameter include a current (Imb) injected into the light reflectance variable mirror 114b (directional coupler 32) and a voltage (Vmb) applied to the light reflectance variable mirror 114b (directional coupler 32). One of the light reflectance variable mirror control parameters may be used alone or two or more of them may be used in combination.

The calculation of the both parameters may be performed with reference to light output information C obtained via the photodetector 17 in addition to the temperature information a. Further, in the case where only one of the absorption region and the light reflectance variable mirror is used, the parameter to be used can be only one of the both parameters.

Then, on the basis of the absorption region control parameter, a current (Ima, the arrow b1 in FIG. 1) is injected into the absorption region 114a from the current distribution circuit 13b via the current-carrying electrodes 22a and 22b, and thereby the light absorption loss of the absorption region 114a is controlled. On the basis of the light reflectance variable mirror control parameter, a voltage (Vmb, the arrow b2 in FIG. 1) is applied to the light reflectance variable mirror 114b (directional coupler 32) from the current distribution circuit 13b via the current-carrying electrode 31, and thereby the light reflectance by the light reflectance variable mirror 114b is controlled. Thereby, in the wavelength tunable laser device of the present Embodiment, a desired output light intensity of the laser light A emitted from the wavelength tunable laser 11 can be obtained.

In the wavelength tunable laser device of the present invention, even when the temperature of the wavelength tunable laser is changed, the oscillation threshold value and the efficiency thereof can be kept constant based on the laser theory. Therefore, the aforementioned effects can be obtained. Hereinafter, the laser theory will be described using Equations. However, the following Equations are just theoretical equations, and an actual phenomenon in the wavelength tunable laser device of the present invention may not fully agree with the following Equations and the description thereof. Further, the following numerical values are merely illustrative and do not limit the present invention.

The drive current to the gain region required for obtaining a desired light output is decided by an oscillation threshold current and an efficiency. The oscillation threshold current correlates with an oscillation threshold gain gth, and is expressed by the following Equation (1).

$$\alpha M + \alpha i = \Gamma gth = \Gamma(N-Ng)dg/dN \approx \Gamma N dg/dN \quad (1)$$

$\Gamma$: light confinement coefficient
$\alpha M$: mirror loss of wavelength tunable laser
$\alpha i$: internal loss
N: carrier density
Ng: transparent carrier density
dg/dN: differential gain Further, the efficiency of the wavelength tunable laser correlates with an external differential quantum efficiency $\eta d$, and is expressed by the following Equation (2).

$$\eta d = \eta i \alpha M / (\alpha \alpha M + \alpha i) \quad (2)$$

$\eta i$: internal differential quantum efficiency

For example, in the case where an InGaAsP/InP based material is used for the gain region, the dg/dN is decreased by 5.4% and the $\eta d$ is decreased by 7.4% with 20K increase of the temperature. For example, in the case where the $\alpha M$ before the temperature change is 20 cm$^{-1}$ and the $\alpha i$ before the temperature change is 20 cm$^{-1}$, when the temperature is increased by 20K, the light reflectance of the light reflectance variable mirror is reduced to increase the $\alpha M$ to 22.6 cm$^{-1}$. Further, the light absorption loss is reduced by the reduction of the amount of the current injected into the absorption region to increase the $\alpha i$ to 19.5 cm$^{-1}$. Thereby, the gth and the $\eta d$ can be kept constant. As a result, an amount of the drive current injected into the gain region can be kept constant.

As described above, with respect to the wavelength tunable laser device of the present invention, since the wavelength tunable laser can be controlled easily and there is no need to increase the drive current in the gain region even at a high temperature, the life degradation of the element is not caused and the reliability of the device is high.

In the wavelength tunable laser device of the present Embodiment, in addition to the both parameters, the circuit 13a calculates a wavelength stabilization region control parameter for controlling the wavelength stabilization region 112 and a wavelength tunable filter region control parameter for controlling the wavelength tunable filter region 113 based on the temperature information a. An example of the wavelength stabilization region control parameter includes a current (IPC) injected into the wavelength stabilization region 112. An example of the wavelength tunable filter region control parameter includes a current (IF) injected into the wavelength tunable filter region 113. The calculation of these parameters may be performed with reference to the light output information C obtained via the photodetector 17 in addition to the temperature information a.

Then, on the basis of the wavelength stabilization region control parameter, a current (IPC, the arrow d in FIG. 1) is injected into the wavelength stabilization region 112 from the current distribution circuit 13b, and thereby the wavelength stabilization region 112 is controlled. On the basis of the wavelength tunable filter region control parameter, a current (IF, the arrow e in FIG. 1) is injected into the wavelength tunable filter region 113 from the current distribution circuit 13b, and thereby the wavelength tunable filter region 113 is controlled. Thereby, in the wavelength tunable laser device of the present Embodiment, a desired oscillation wavelength can be obtained. Therefore, the operation of the wavelength tunable laser does not become unstable by the change in oscillation wavelength because of the refractive index change or the like of the wavelength tunable filter by the temperature change. This makes the wavelength tunable laser device of the present Embodiment highly reliable. Further, in the wavelength tunable laser device of the present Embodiment, both of the wavelength tunable mechanism and the light loss control unit can be controlled by the aforementioned control mechanism based on the temperature information of the wavelength tunable laser obtained from the temperature detecting element. Therefore, the structure of the device is simple as compared to the case in which the wavelength tunable mechanism and the light loss control unit are controlled by different control mechanisms, for example.

In the wavelength tunable laser device of the present Embodiment, in addition to the aforementioned parameters, the circuit 13a calculates a gain region control parameter for controlling the gain region 111 based on the temperature information a. In the present invention, although this control parameter is optional and not required to be calculated, this control parameter is preferably calculated. An example of the gain region control parameter includes a current (ISOA) injected into the gain region 111. The calculation of this parameter may be performed with reference to the light output information C obtained via the photodetector 17 in addition to the temperature information a.

Then, on the basis of the gain region control parameter, a current (ISOA, the arrow c in FIG. 1) is injected into the gain region 111 from the current distribution circuit 13b, and thereby the gain region 111 is controlled. Thereby, for example, the output light intensity of the laser light A emitted from the wavelength tunable laser 11 can be controlled to be a desired value with higher accuracy.

In the wavelength tunable laser device of the present Embodiment, in addition to the aforementioned parameters, the circuit 13a calculates a TEC control parameter (temperature controller control parameter) for controlling the TEC 15 based on the temperature information a. In the present invention, although this control parameter is optional and not required to be calculated, this control parameter is preferably calculated. An example of the TEC control parameter includes a current (ITEC) injected into the TEC 15. The calculation of the TEC control parameter may be performed with reference to the light output information C obtained via the photodetector 17 in addition to the temperature information a.

In the case where the temperature of the wavelength tunable laser 11 is increased and exceeds the temperature range controllable by the absorption region 114a and the light reflectance variable mirror 114b, for example, a current (ITEC, the arrow f in FIG. 1) is injected into the TEC 15 from the current distribution circuit 13b based on the TEC control parameter to activate the TEC 15. Thereby, the temperature of the wavelength tunable laser is reduced to the aforementioned temperature range. This makes it possible to obtain a desired wavelength and a desired output light intensity of the laser light A emitted from the wavelength tunable laser 11, for example, even when the temperature of the wavelength tunable laser exceeds the aforementioned temperature range. As a result, the reliability of the wavelength tunable laser device of the present Embodiment is further increased.

The wavelength tunable laser device of the present Embodiment can be used as a light source of an optical module, for example. This makes it possible to obtain a power saving and highly reliable optical module.

In the wavelength tunable laser device of the present Embodiment, the gain region in the wavelength tunable laser may include a coupled quantum well structure, for example. Although the coupled quantum well structure is not particularly limited, for example, the coupled quantum well structure is a quantum structure obtained by providing from two to five types of quantum wells having different gain peak wavelengths from one another and laminating at least two of each type of quantum wells continuously, wherein the thickness of at least one of barrier layers interposed therebetween is from 2 nm to 5 nm. For example, the coupled quantum well structure can obtain a wide gain band, which is at least 60 nm, without deteriorating properties such as a threshold current and the like. Therefore, a required wavelength tunable range can be maintained.

Figure 5A:
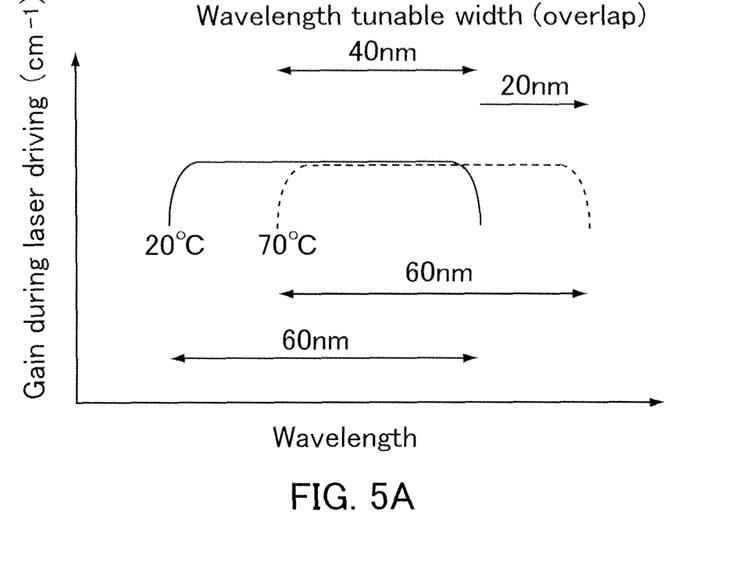
FIG. 5A is a graph for explaining the change of the gain bandwidth by the temperature in a coupled quantum well.
Figure 5B:
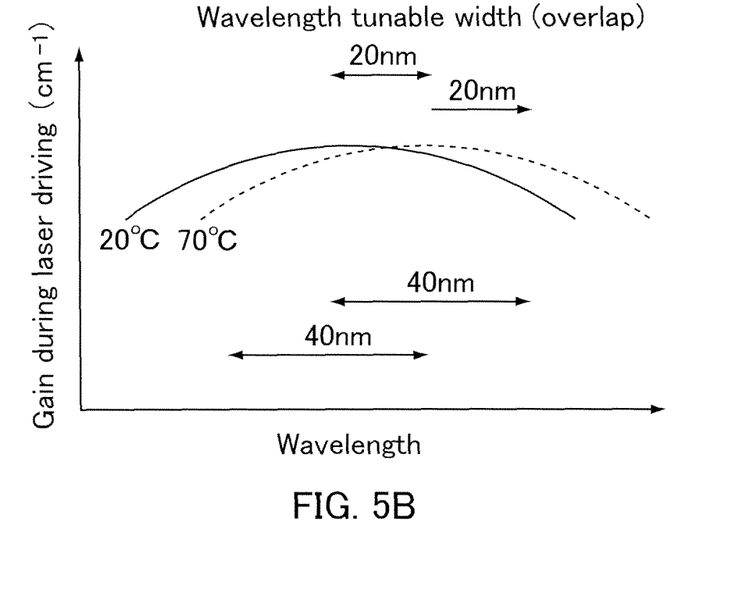
FIG. 5B is a graph for explaining the change of the gain bandwidth by the temperature in a normal quantum well.

The gain region includes a certain limited gain band. The oscillation wavelength range is limited by this gain band. This gain band shifts toward the long wavelength side with increasing temperature. The gain band shifts toward the long wavelength side by about 0.4 nm per degree under a constant current density, for example. Therefore, in the case where the wavelength tunable laser is operated within a certain temperature range, an overlapped wavelength tunable range may be narrowed or disappeared at worst between the lower limit and the upper limit of the operation temperature. As shown in FIG. 5B, the gain band of a normal quantum well structure is, for example, about 40 nm. Therefore, the overlap of the gain bands in the case where the temperature is changed by 50° C. is expressed by the following equation: 40−20=20 nm. As a result, for example, full band drive in the C band becomes difficult. On the other hand, as shown in FIG. 5A, the gain band of the coupled quantum well structure is, for example, at least 60 nm. Therefore, the overlap of the gain bands in the case where the temperature is changed by 50° C. is expressed by the following equation: 60−20=40 nm. As a result, for example, full band drive in the C band becomes possible. Accordingly, by using the coupled quantum well structure, for example, the reliability can further be increased.

For example, the coupled quantum well structure prepares three types of quantum well structures having different gain peaks and uses these quantum structures as a single unit.

In the first quantum well structure, the well is a 5.5-nm wide compressive strained InGaAsP having a composition wavelength of 1.63 μm, the barrier is an InGaAsP having a composition wavelength of 1.25 μm, and four quantum wells are laminated. Among them, the thickness of the barrier layer between the first quantum well and the second quantum well and the thickness of the barrier layer between the third quantum well and the fourth quantum well are each 4 nm, and the thickness of the barrier layer between the second quantum well and the third quantum well is 10 nm. That is, the first quantum well and the second quantum well and the third quantum well and the fourth quantum well are respectively bonded.

In the second quantum well structure, the well is a 5-nm wide compressive strained InGaAsP having a composition wavelength of 1.52 μm and the barrier is an InGaAsP having a composition wavelength of 1.25 μm. The thicknesses of the barrier layers are the same as those described for the first quantum well structure.

In the third quantum well structure, the well is 4.5-nm wide compressive strained InGaAsP having a composition wavelength of 1.52 μm and the barrier is an InGaAsP having a composition wavelength of 1.25 μm. The thicknesses of the barrier layers are the same as those described for the first quantum well structure.

These quantum well structures are grown, for example, in order of the third well, the second well, and the first well at the growth pressure of 98.6 kPa and the growth temperature of 625° C. In this manner, the coupled quantum well structure can be formed. Further, by arranging SCHs (separate confinement heterostructures) at the both side of this quantum well structure, a semiconductor optical amplifier (SOA) can be formed.

Embodiment 2

Figure 6:
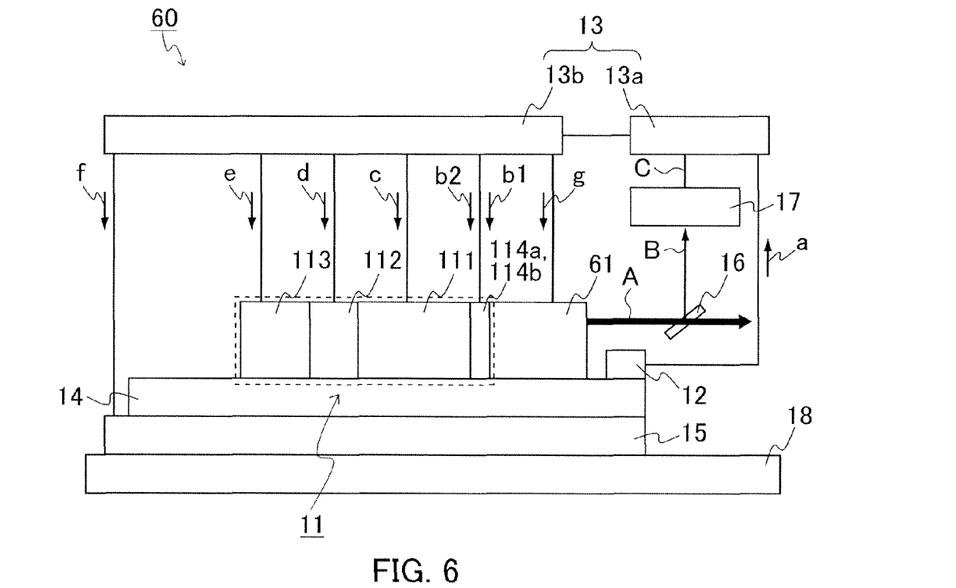
FIG. 6 is a block diagram showing another example of the configuration of the wavelength tunable laser device (Embodiment 2) of the present invention.

FIG. 6 shows the configuration of the wavelength tunable laser device of the present Embodiment. As shown in FIG. 6, in a wavelength tunable laser device 60, a functional element 61 is monolithically integrated at the opposite side to the side where the gain region 111 is provided of an absorption region 114a and a light reflectance variable mirror 114b. Except for this, the configuration of the wavelength tunable laser device 60 is the same as that of the wavelength tunable laser device of Embodiment 1 shown in FIG. 1. Here, although a TEC is an optional configuration and is not indispensable, the wavelength tunable laser device is preferably provided with the TEC as in Embodiment 1.

Although the functional element 61 is monolithically integrated at the upper side of the same subcarrier (semiconductor substrate) 14 as a wavelength tunable laser 11, for example, separately provided elements may be combined. Further, the functional element 61 may be optically connected to the wavelength tunable laser 11 in the state where it is folded back via the light reflectance variable mirror 32 as shown in FIG. 3A or may be optically connected to the light emitting end surface of the wavelength tunable laser 11 directly, for example. Examples of the functional element 61 include a light modulator that modulates the laser light emitted from the wavelength tunable laser, a variable light attenuator that attenuates the laser light, and a wavelength conversion element that converts the wavelength of the laser light. One of the functional elements may be used alone or two or more of them may be used in combination.

In the wavelength tunable laser device of the present Embodiment, except for the following points, the wavelength tunable laser can be controlled in the same manner as in the wavelength tunable laser device of Embodiment 1 shown in FIG. 1, for example.

A DSP-containing circuit 13a calculates a functional element control parameter for controlling the functional element 61 based on the temperature information a of the wavelength tunable laser 11. An example of the functional element control parameter includes a current (Imc) injected into the functional element 61. The calculation of the functional element control parameter may be performed with reference to the light output information C obtained via the photodetector 17 in addition to the temperature information a.

Then, on the basis of the functional element control parameter, a current (Imc, the arrow g in FIG. 6) is injected into the functional element 61 from the current distribution circuit 13b, and thereby the functional element 61 is controlled. Thereby, the effect of Embodiment 1 can be achieved. In addition, the foregoing makes it possible to add the functions such as laser light modulation and variable light output attenuation (shatter). The control of the functional element based on the functional element control parameter may be performed independently from the controls based on other control parameters, for example.

Embodiment 3

Figure 7:
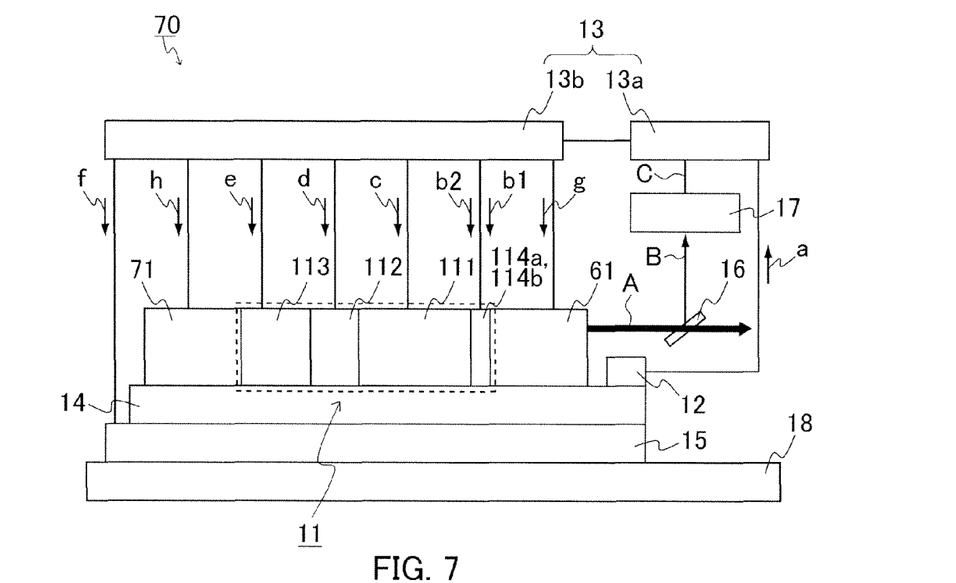
FIG. 7 is a block diagram showing yet another example of the configuration of the wavelength tunable laser device (Embodiment 3) of the present invention.

FIG. 7 shows the configuration of the wavelength tunable laser device of the present Embodiment. As shown in FIG. 7, a wavelength tunable laser device 70 further includes a dummy current injection region 71 formed at the opposite side to the side where an absorption region 114a and a light reflectance variable mirror 114b are provided of a wavelength tunable laser 11. The dummy current injection region 71 corresponds to a part of a current path that keeps the whole electric power applied to the wavelength tunable laser 11 constant. Except for this, the configuration of the wavelength tunable laser device 70 is the same as that of the wavelength tunable laser device of Embodiment 2 shown in FIG. 6. Here, although a TEC is an optional configuration and is not indispensable, the wavelength tunable laser device is preferably provided with the TEC as in Embodiment 1.

In the wavelength tunable laser device of the present Embodiment, except for the following points, the wavelength tunable laser can be controlled in the same manner as in the wavelength tunable laser device of Embodiment 2 shown in FIG. 6, for example.

A DSP-containing circuit 13a calculates a dummy current injection region control parameter (current path control parameter) for controlling the dummy current injection region 71 based on the temperature information a of the wavelength tunable laser 11. An example of the dummy current injection region control parameter includes a total input electric power control current (ID) injected into the dummy current injection region 71. The calculation of the dummy current injection region control parameter may be performed with reference to the light output information C obtained via the photodetector 17 in addition to the temperature information a.

Then, on the basis of the dummy current injection region control parameter, a total input electric power control current (ID, the arrow h in FIG. 7) is injected into the dummy current injection region 71 from the current distribution circuit 13b, and thereby the dummy current injection region 71 is controlled. Thereby, the effects of Embodiments 1 and 2 can be achieved. In addition, the foregoing makes it possible to strike a balance among the total amount of the dummy electric power and the element control electric power, the amount of heat generation inside the element, and the heat release to outside via a heat sink. As a result, the element temperature dispersion due to decrease or increase in total input electric power based on the various parameters that can be caused in the case where the temperature control of the wavelength tunable laser 11 is not performed can be prevented.

As described above, the wavelength tunable laser device of the present invention is power saving and highly reliable. Accordingly, the wavelength tunable laser device of the present invention can be applied to a middle and long-distance light source for wavelength multiplex communications used for a trunk system and an access system, for example. However, the use thereof is not limited and can be applied to a wide range of fields.

The invention of the present application was described above with reference to the embodiments. However, the invention of the present application is not limited to the above-described embodiments. Various changes that can be understood by those skilled in the art can be made in the configurations and details of the invention of the present application within the scope of the invention of the present application.

This application claims priority from Japanese Patent Application No. 2009-243914 filed on Oct. 22, 2009. The entire subject matter of the Japanese Patent Application is incorporated herein by reference.

EXPLANATION OF REFERENCE NUMERALS 10, 60, and 70 wavelength tunable laser device
11 wavelength tunable laser
12 temperature detecting element
13 controller
13a DSP-containing circuit
13b current distribution circuit
14 subcarrier
15 TEC
16 beam splitter
17 photodetector
18 heat sink
21 semiconductor
22a, 22b, and 31 current-carrying electrode
32 directional coupler
33 reflector
34a and 34b optical waveguide
35 and 61 functional element
71 dummy current injection region
111 gain region (light source)
112 wavelength stabilization region (wavelength tunable mechanism)
113 wavelength tunable filter region (wavelength tunable mechanism)
114a absorption region (light loss control unit)
114b light reflectance variable mirror (light loss control unit)

The invention claimed is:
1. A wavelength tunable laser device, comprising:
a wavelength tunable laser;
a temperature detecting element; and
a controller, wherein
the wavelength tunable laser comprises:
  a laser resonator comprising:
    a light source; and
    wavelength tunable mechanisms; and
  at least one light loss control unit,
the light loss control unit comprises at least one of an absorption region and a light reflectance variable mirror,
the absorption region is capable of controlling a light absorption loss of the laser resonator,
the light reflectance variable mirror is capable of controlling a light reflectance at a light emitting end surface of the laser resonator,
the light loss control parameter for controlling the absorption region is an absorption region control parameter,
the light loss control parameter for controlling the light reflectance variable mirror is a light reflectance variable mirror control parameter,
the temperature detecting element is thermally connected to the wavelength tunable laser and is electrically connected to the controller,
the controller is electrically connected to the wavelength tunable mechanisms and the light loss control unit,
the temperature detecting element detects a temperature of the wavelength tunable laser, and
the controller obtains temperature information of the wavelength tunable laser from the temperature detecting element, calculates wavelength tunable control parameters and light loss control parameters based on the temperature information, controls the wavelength tunable mechanisms based on the wavelength tunable control parameters, and controls the light loss control unit based on the light loss control parameter.

2. The wavelength tunable laser device according to claim 1, wherein
the absorption region control parameter comprises at least one of a current injected into the absorption region and a voltage applied to the absorption region.

3. The wavelength tunable laser device according to claim 1, wherein
the light source comprises a gain region, and
the gain region includes a coupled quantum well structure.

4. The wavelength tunable laser device according to claim 1, wherein
the wavelength tunable mechanisms include:
  a wavelength tunable filter region; and
  a wavelength stabilization region.

5. The wavelength tunable laser device according to claim 1, wherein
the light reflectance variable mirror comprises:
  a current-carrying electrode; and
  a directional coupler; and
  a reflector.

6. The wavelength tunable laser device according to claim 1, further comprising a temperature controller for controlling a temperature of the wavelength tunable laser.

7. The wavelength tunable laser device according to claim 1, further comprising at least one functional element selected from the group consisting of a modulator, a variable optical attenuator, and a wavelength conversion element.

8. The wavelength tunable laser device according to claim 1, further comprising a current path that keeps the whole electric power applied to the wavelength tunable laser constant.

9. An optical module comprising the wavelength tunable laser device according to claim 1.

10. A method of controlling a wavelength tunable laser, wherein
the method uses the wavelength tunable laser device according to claim 1, and
the method comprises:
  detecting a temperature of the wavelength tunable laser by the temperature detecting element;
  obtaining temperature information of the wavelength tunable laser by the controller from the temperature detecting element;
  calculating wavelength tunable control parameters and light loss control parameters by the controller based on the temperature information;
  controlling the wavelength tunable mechanisms by the controller based on the wavelength tunable control parameters; and
  controlling the light loss control unit by the controller based on the light loss control parameter, wherein the light loss control parameter for controlling the absorption region is an absorption region control parameter, and the light loss control parameter for controlling the light reflectance variable mirror is a light reflectance variable mirror control parameter.

11. The method according to claim 10, wherein
the absorption region control parameter is at least one of a current injected into the absorption region and a voltage applied to the absorption region.

12. A method of controlling a wavelength tunable laser, wherein
the method uses the wavelength tunable laser device according to claim 3, and
the method comprises:
  detecting a temperature of the wavelength tunable laser by the temperature detecting element;
  obtaining temperature information of the wavelength tunable laser by the controller from the temperature detecting element;
  calculating wavelength tunable control parameters and light loss control parameters by the controller based on the temperature information;
  controlling the wavelength tunable mechanisms by the controller based on the wavelength tunable control parameters;
  controlling the light loss control unit by the controller based on the light loss control parameter;
  calculating a gain region control parameter by the controller based on the temperature information; and
  controlling the gain region by the controller based on the gain region control parameter.

13. A method of controlling a wavelength tunable laser, wherein
the method uses the wavelength tunable laser device according to claim 6, and
the method comprises:
  detecting a temperature of the wavelength tunable laser by the temperature detecting element;
  obtaining temperature information of the wavelength tunable laser by the controller from the temperature detecting element;
  calculating wavelength tunable control parameters and light loss control parameters by the controller based on the temperature information;
  controlling the wavelength tunable mechanisms by the controller based on the wavelength tunable control parameters;
  controlling the light loss control unit by the controller based on the light loss control parameter;
  calculating a temperature controller control parameter by the controller based on the temperature information; and
  controlling the temperature controller by the controller based on the temperature controller control parameter.

14. A method of controlling a wavelength tunable laser, wherein
the method uses the wavelength tunable laser device according to claim 7, and
the method comprises:
  detecting a temperature of the wavelength tunable laser by the temperature detecting element;
  obtaining temperature information of the wavelength tunable laser by the controller from the temperature detecting element;
  calculating wavelength tunable control parameters and light loss control parameters by the controller based on the temperature information;
  controlling the wavelength tunable mechanisms by the controller based on the wavelength tunable control parameters;
  controlling the light loss control unit by the controller based on the light loss control parameter;
  calculating a functional element control parameter by the controller based on the temperature information; and
  controlling the functional element by the controller based on the functional element control parameter.

15. A method of controlling a wavelength tunable laser, wherein
the method uses the wavelength tunable laser device according to claim 8, and
the method comprises:
  detecting a temperature of the wavelength tunable laser by the temperature detecting element;
  obtaining temperature information of the wavelength tunable laser by the controller from the temperature detecting element;
  calculating wavelength tunable control parameters and light loss control parameters by the controller based on the temperature information;
  controlling the wavelength tunable mechanisms by the controller based on the wavelength tunable control parameters;
  controlling the light loss control unit by the controller based on the light loss control parameter;
  calculating a current path control parameter by the controller based on the temperature information; and
  controlling the current path by the controller based on the current path control parameter.

16. The wavelength tunable laser device according to claim 1,
wherein the light source comprises a gain region, and
the gain region includes a coupled quantum well structure.

17. The wavelength tunable laser device according to claim 2,
wherein the light source comprises a gain region, and
the gain region includes a coupled quantum well structure.

18. The wavelength tunable laser device according to claim 3,
wherein the wavelength tunable mechanisms include:
  a wavelength tunable filter region; and
  a wavelength stabilization region.

* * * * *